US008068795B2

(12) United States Patent
Bavisi et al.

(10) Patent No.: US 8,068,795 B2
(45) Date of Patent: Nov. 29, 2011

(54) RF MULTIBAND TRANSMITTER WITH BALUN

(75) Inventors: Amit D. Bavisi, Gilbert, AZ (US); Walter J. Grandfield, Phoenix, AZ (US); Darioush Keyvani, Scottsdale, AZ (US); Mark A. Kirschenmann, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 427 days.

(21) Appl. No.: 12/409,894

(22) Filed: Mar. 24, 2009

(65) Prior Publication Data

US 2010/0248660 A1  Sep. 30, 2010

(51) Int. Cl.
*H04B 1/04* (2006.01)

(52) U.S. Cl. .................. 455/103; 455/120; 455/125

(58) Field of Classification Search .................. 455/103, 455/120, 125, 127.1–127.4; 333/25
See application file for complete search history.

(56) References Cited

U.S. PATENT DOCUMENTS

| 5,572,227 | A | 11/1996 | Pal et al. |
| 6,611,691 | B1 | 8/2003 | Zhou et al. |
| 6,813,480 | B2 | 11/2004 | Losser et al. |
| 6,959,178 | B2 | 10/2005 | Macedo et al. |
| 7,266,352 | B2 | 9/2007 | Soe et al. |
| 7,269,391 | B2 | 9/2007 | Chiu et al. |
| 2004/0198250 | A1* | 10/2004 | Khorram ........................ 455/91 |
| 2005/0248418 | A1 | 11/2005 | Govind et al. |
| 2006/0094357 | A1 | 5/2006 | McCorkle |
| 2006/0220758 | A1 | 10/2006 | Rachedine et al. |
| 2007/0152770 | A1 | 7/2007 | Mondal |
| 2007/0223615 | A1 | 9/2007 | Dosanjh et al. |
| 2008/0136560 | A1 | 6/2008 | Bavisi et al. |
| 2008/0139131 | A1* | 6/2008 | Macphail ..................... 455/90.2 |
| 2008/0258837 | A1 | 10/2008 | Liu et al. |

FOREIGN PATENT DOCUMENTS

WO   WO 2005/107064 A1   11/2005

OTHER PUBLICATIONS

D. Kaczman et al., A Single-Chip Tri-Band (2100, 1900, 850/800 MHz) WCDMA/HSDPA Cellular Transceiver, IEEE Journal of Solid-State Circuits, vol. 41, No. 5, May 2006.
J. Deng et al., A Dual-Band High Efficiency CMOS Transmitter for Wireless CDMA Applications, IEEE Radio Frequency Integrated Circuits Symposium, 2007.
F. Agnelli et al., Wireless Multi-Standard Terminals: System Analysis and Design of a Reconfigurable RF Front end, IEEE Circuits and Systems Magazine, First Quarter 2006.

* cited by examiner

*Primary Examiner* — Long Nguyen
(74) *Attorney, Agent, or Firm* — Hamilton & Terrile, LLP; Michael Rocco Cannatti

(57) ABSTRACT

A multi-band RF transmitter circuit (30) for a wireless communication device combines a plurality of RF transmission blocks into a single transceiver integrated circuit which includes a shared broadband SVGA (32), a shared tunable balun (34), and an output switching network (38) at the output of the balun to support three different frequency bands. The outputs of the multi-band RF transmitter circuit are connected to separate external power amplifier circuits (42-44), where each power amplifier circuit generates an amplified signal for one of the plurality of predetermined frequency bands.

20 Claims, 6 Drawing Sheets

RF MULTIBAND TRANSMITTER WITH BALUN

BACKGROUND OF THE INVENTION

1. Field of the Invention

The present invention is directed in general to field of information processing. In one aspect, the present invention relates to a multi-band wireless communication device, system and methodology.

2. Description of the Related Art

With the proliferation of new wireless communication standards and/or services which use different communication frequency channels or bands, wireless communication devices and/or network operators must increasingly be capable of providing services on multiple bands. The need of support multiple transmission/reception channels is also driven by spectrum scarcity when network operators providing services on one particular band are required to provide service on a separate band to accommodate its customers. For example, there are many different frequency bands used for mobile wireless applications, including but not limited to the Universal Mobile Telecommunications System (UMTS) frequency bands or frequency ranges designated for the mobile phone operation, such as the UMTS International Mobile Telecommunications (IMT) band operating in the 1.920-2.170 gigahertz (GHz) frequency range, the 3GPP Wideband Code Division Multiple Access (WCDMA) bands, the Personal Communications Services (PCS) band operating in the 1.850-1.990 GHz frequency range, the Digital Communications Services (DCS) band operating in the 1.710-1.880 GHz frequency range, the "900 band" operating in the 880-960 megahertz (MHz) frequency range, the "800 band" operating in the 824-894 MHz frequency range, etc., where each listed frequency band includes both transmit and receive frequencies. Thus, service in a given region could be provided on a GSM system in a 900 MHz frequency band and on a DCS system at an 1800 MHz frequency band, or even a third system, such as a PCS system in a 1900 frequency band. Similarly, service in another region could include an AMPS system in an 800 MHz frequency band and a PCS system in a 1900 frequency band. In this environment, a single network operator may not provide service in a plurality of systems in a given region. In similar fashion, a user of a wireless communication device may require the ability to roam across other systems in the event the user's device is unable to obtain service on one of the systems to which the user subscribes. Thus, mobile phone manufactures often need to design phones that are operable in multiple frequency bands for use by one or more different mobile phone service providers. Similar needs exist for other wireless applications.

While wireless communication devices, such as cellular radio telephones, have been developed which can communicate over a plurality of frequency bands, such devices typically use a transmitter subsystem which includes a dedicated transformer/balun and variable gain amplifier (VGA) for each frequency band. The conventional approach is illustrated in FIG. 1 which depicts a simplified schematic illustration of a conventional transmitter architecture for using as many baluns and VGAs as there are frequency bands. As depicted, a first output 1 from a mixer core (not shown) is fed into a first variable gain amplifier 4 which provides a differential output having a first fixed gain to the first transformer/balun 7 which converts the differential outputs to a single-ended output that is amplified by the first power amplifier 10 into a first transmission signal 13 on a first frequency band. In similar fashion, a second output 2 from a mixer core is fed into a second variable gain amplifier 5 which provides a differential output having a fixed gain to the second transformer/balun 8 which converts the differential outputs to a single-ended output that is amplified by the second power amplifier 11 into a second transmission signal 14 on a second frequency band, and a third output 3 from a mixer core is fed into a third variable gain amplifier 6 which provides a differential output having a fixed gain to the third transformer/balun 9 which converts the differential outputs to a single-ended output that is amplified by the third power amplifier 12 into a third transmission signal 15 on a third frequency band. As can be seen from this example, the inclusion of a dedicated balun and VGA for each band increases the overall device size, cost and power consumption. For example, with a cellular phone covering multiple 2G and 3G bands, twenty percent of the transceiver die area is used for the dedicated baluns and VGAs. Overall design complexity is also increased when using dedicated baluns and VGAs since, with multiple RF blocks or chains, the die routing is more complex, the drive capability must be increased, and the design cycle time is increased.

Accordingly, an improved transmitter design and methodology is needed to overcome the problems in the art, such as outlined above. Further limitations and disadvantages of conventional approaches will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
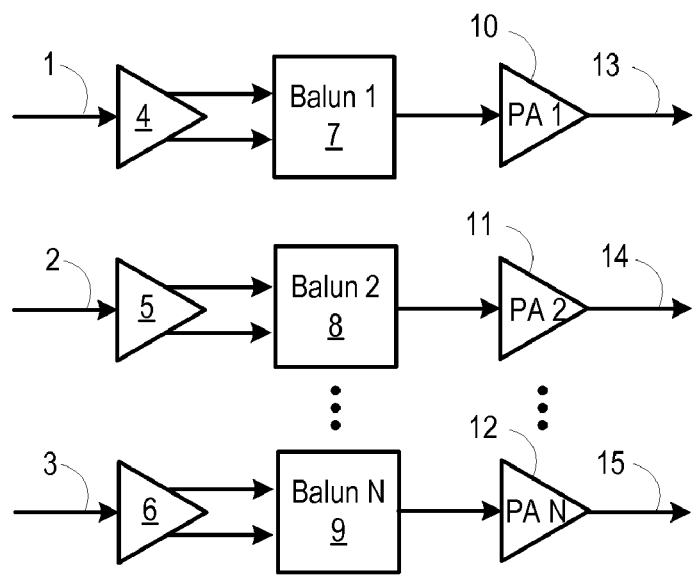
FIG. 1 is simplified schematic illustration of a conventional transmitter architecture which uses a balun and voltage gain amplifier for each transmission frequency band.

A system and methodology are disclosed for a multi-band wireless transmitter which uses a single variable gain amplifier and tunable balun to transmit information over multiple bands. To this end, information to be transmitted is first amplified with a variable amplifier which provides controlled gain steps over the frequencies of interest. For example, a broadband segmented variable gain amplifier (SVGA) may be used which provides an accurate gain or amplification over a wide range of frequencies, such as 650 MHz to 915 MHz (Bands 12-14 through cell band) and/or 1400 MHz (WCDMA Band XI) to 2000 MHz (bands 1,2,3,11 and DCS and PCS). The amplified signal is then converted to a single ended output through a tunable transformer/balun which can be tuned to the desired transmission band using tuning or switched capacitors at an input and/or output of the balun for tuning the transmitter circuit to the desired transmission frequency. The tunable transformer/balun also provides impedance transformation to match the output from the variable amplifier to the input of the subsequent power amplifier. In particular, the single-ended output of the tunable balun is connected over an output switch network to a dedicated power amplifier circuit for the transmission band of interest. In this way, even though some bands and frequencies are used interchangeably and different bands can exist in the same frequency space, a single SVGA and tunable balun can cover the different bands (e.g., Cell and PCS) so that the number of SVGAs and baluns is always less than the number of bands corresponding to different frequencies.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, although the present invention finds particular application in cellular telephones, the invention could be applied to any wireless communication device, including pagers, electronic organizers, or computers under control of algorithms or operations on data within a computer memory that are performed by a processing engine or unit, such as a central processing unit (CPU). Such descriptions and representations are used by those skilled in the art to describe and convey the substance of their work to others skilled in the art. Various illustrative embodiments of the present invention will now be described in detail below with reference to the figures.

Figure 2:
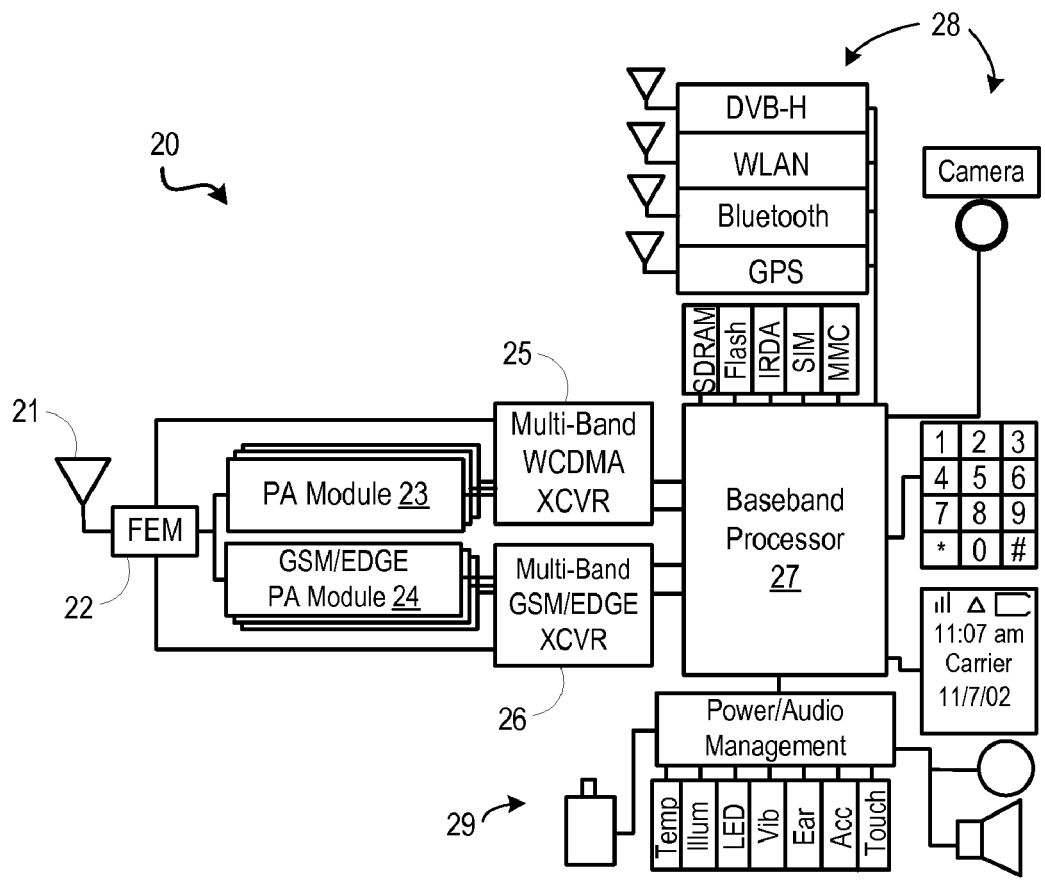
FIG. 2 depicts a block diagram of a multi-band wireless communication device in accordance with selected embodiments of the present invention.

Turning now to FIG. 2, there is shown a block diagram of a multi-band wireless communication device 20 in accordance with selected embodiments of the present invention. As depicted, the wireless communication device 20 includes a baseband processor 27, one or more multi-band transceiver circuits 25, 26, each of which has a plurality of power amplifier modules 23, 24 for generating the necessary communication protocol for operating in a cellular system. The baseband processor 27, alone or in combination with a host processor (not shown) uses memory (e.g., SDRAM, Flash, IRDA, SIM, MMC, etc.) to execute the steps necessary to generate the protocol and to perform other functions for the wireless communication device 20, such as writing to a display, accepting information from a keypad, capturing video from a camera, communicating over additional wireless protocols 28 (e.g., DVB-H, WLAN, Bluetooth, GPS, etc.), and/or implementing power and/or audio management functions 29. For signals received at the antenna 21, the antenna output is gained and filtered at the front end modulator 22, and then passed to the appropriate transceiver circuit module 25, 26 which converts the received analog signal to a digital signal which is processed to decode and extract information bits for the baseband processor 27. To transmit a signal, the appropriate transceiver circuit module 25, 26 processes the transmit data (e.g., encodes, modulates, etc.) and for conversion to an analog signal which is then passed to the appropriate power amplifier module 23, 24 and front end modulator 22 for transmission over the antenna 21. In particular, an analog transmit signal received at either multi-band transceiver circuits 25, 26 from the baseband processor 27 is processed for transmission on one of a plurality of transmission frequency bands by amplifying the received analog transmit signal with a shared variable gain amplifier, and then applying the amplified analog transmit signal to a shared tunable impedance matching network which supports a plurality of transmission frequency bands. In selected embodiments, the shared tunable impedance matching network may be implemented in an integrated circuit transceiver (e.g., multi-band WCDMA transceiver 25) with an integrated planar balun having a plurality of switched capacitors connected to the primary and/or second winding of the balun to tune the center frequency of the balun to different bands. In addition, the integrated circuit transceiver may also include an output switch network or switching multiplexer connected to the output winding of the balun in the form of a single pole multiple throw switch which connects the balun's secondary terminal to the different inputs of the external power amplifier circuits (e.g., PA modules 23).

Figure 3:
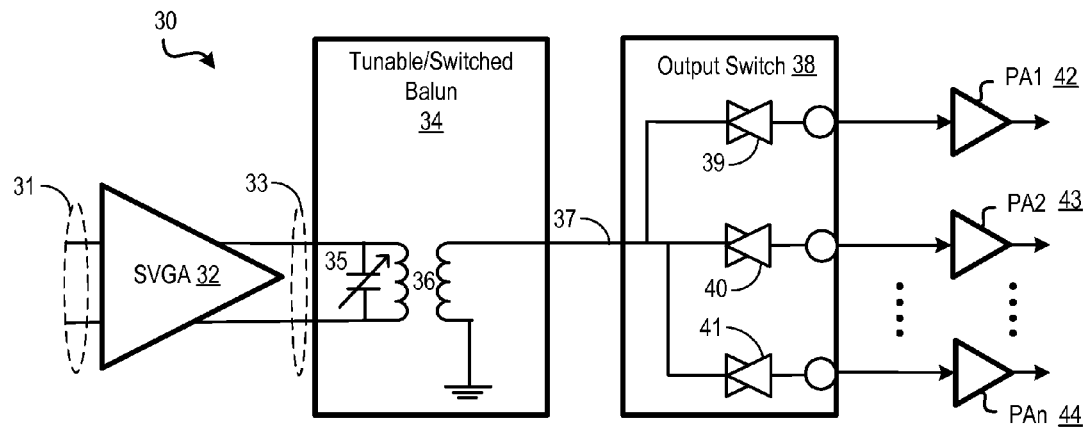
FIG. 3 is simplified schematic illustration of a multi-band transmitter architecture which uses a single segmented voltage gain amplifier, tunable balun, and output switch to transmit a plurality of frequency bands.

An example implementation of a multi-band transceiver circuit module is shown in FIG. 3 which is a simplified schematic illustration of a multi-band transmitter architecture 30 which uses a single segmented voltage gain amplifier 32, a tunable balun 34, and an output switch 38 to connect to various inputs of separate power amplifiers to transmit on more than one frequency band. In the disclosed multi-band transmitter architecture 30, an input transmit signal 31 from a mixer core (not shown) is fed into the broadband SVGA 32 which provides an amplified differential output 33. By using the broadband SVGA 32, the gain or amplification of the input transmit signal 31 may be controlled to provide predetermined signal gain over the frequencies of interest. For example, the broadband SVGA 32 can be designed to provide high gain at 650 MHz to 915 MHz (Bands 12-14 through cell band) or to cover 1400 MHz (WCDMA Band XI) to 2000 MHz (bands 1, 2, 3, 11 and DCS and PCS). The amplified differential output 33 is then converted to a single-ended output 37 by the tunable balun 34 which may include a balun 36 with one or more switched capacitors 35 connected to the primary or secondary winding of the balun 36 for tuning the center frequency of the balun 36 to the desired transmit frequency or band. In selected embodiments, where the tunable balun 34 comprises an integrated narrowband balun 36 with a first adjustable or switched capacitance 35 at a primary winding and a second tuning capacitor (not shown) at a secondary winding to tune the center frequency of the tunable balun 34. Finally, the single-ended output 37 from the tunable balun 34 is connected to an input of one of the power amplifiers 42-44 using the output switch 38. As depicted, the output switch 38 includes a plurality of switching gates 39-41 which are controlled by control signals (not shown) so that one of the switching gates (e.g., gate 39) couples the single-ended output 37 to the appropriate power amplifier circuit (e.g., PA1

42) for the desired transmission frequency band. By using the SVGA-balun combination to generate transmit signals over a plurality of frequency bands, the overall component count for the wireless communication device is reduced, the overall size of the transceiver circuitry is significantly reduced, and the DC power efficiency is improved as compared to conventional designs. In addition, by reducing the number of SVGAs and baluns needed to support a given number of bands, the design cycle time is reduced, as is the overall circuit complexity. In addition, the wireless communication device can be efficiently constructed to support all of the cellular frequency bands for the U.S., Europe and Asia with a smaller die and smaller package area.

Figure 4:
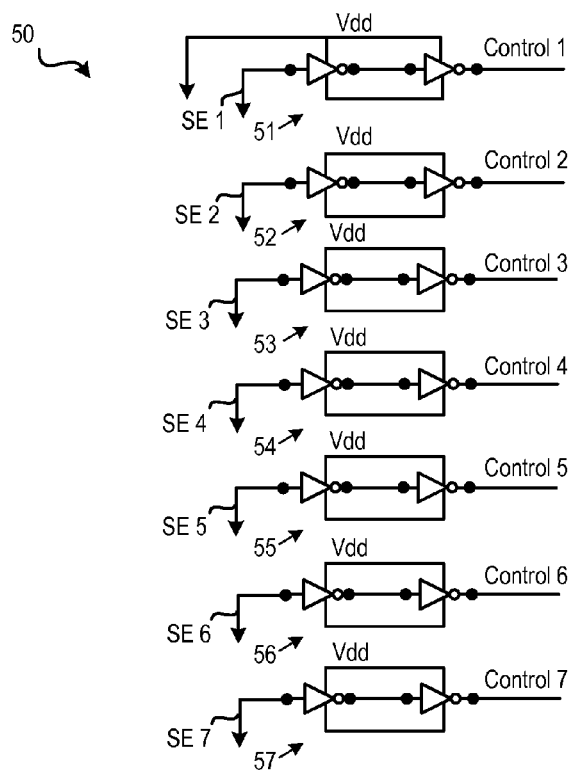
FIG. 4 is a circuit schematic representation of a control network for generating tuning control signals for the balun tuning capacitors.

To illustrate an example implementation of the tunable balun 34, reference is now made to FIG. 4 which depicts a circuit schematic representation of a control network 50 for generating tuning control signals (Control 1 through Control 7) for the balun tuning capacitors. As depicted, the control network 50 includes a plurality of driver circuits 51-57, each of which receives a source enable input signal (e.g., SEI 1 through SEI7) and generates therefrom an output tuning control signal (e.g., Control 1 through Control 7). While the driver circuits (e.g., 51) may be implemented as shown with a series-coupled pair of inverter circuits connected between first and second reference voltages (e.g., Vdd and ground), it will be appreciated that any desired driver and/or buffer circuit may be used to generate the tuning control signals, or these signals may be generated directly by a host processor or baseband processor unit.

Figure 5:
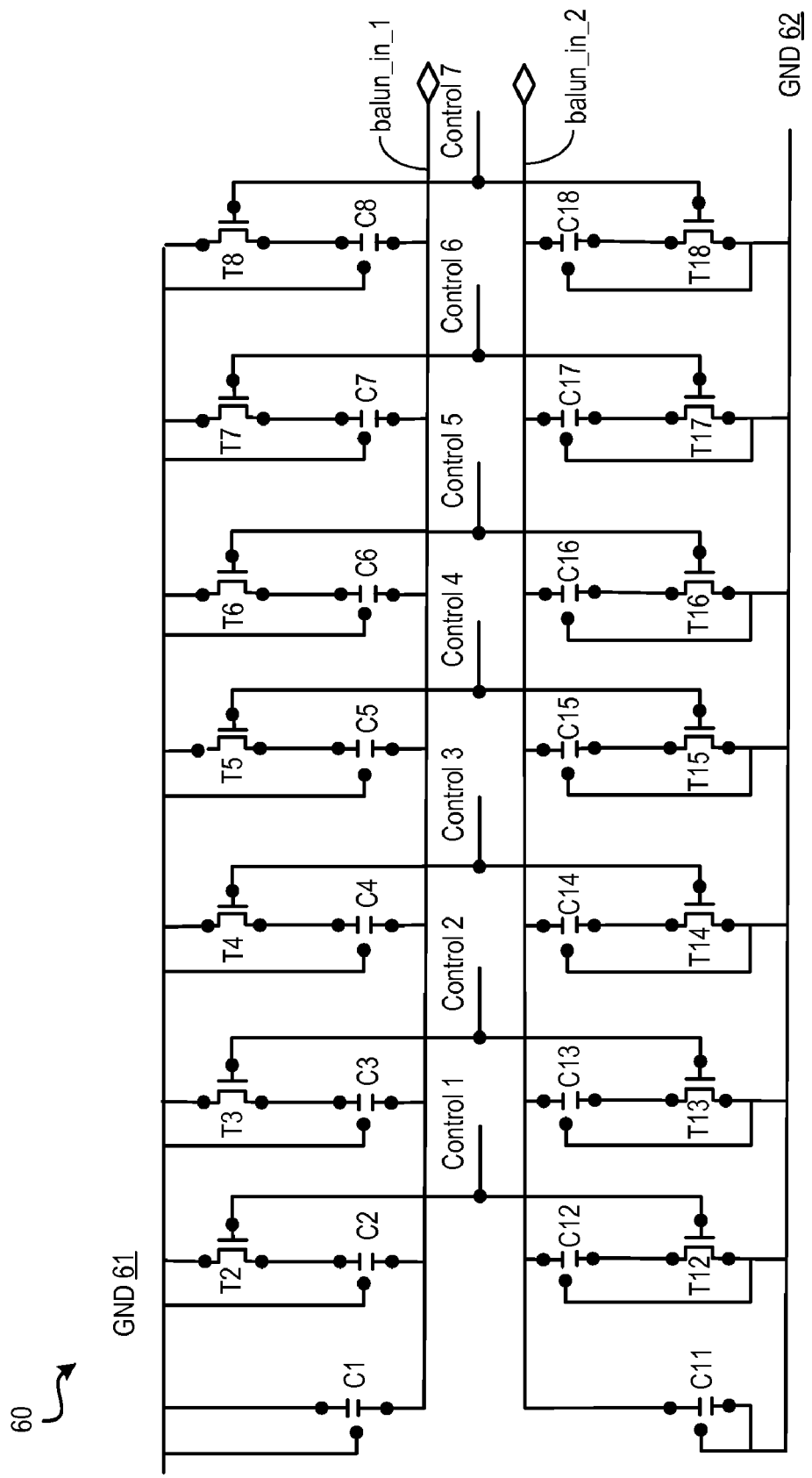
FIG. 5 is a circuit schematic representation of the balun tuning capacitors.

The tuning control signals (Control 1 through Control 7) generated by the control network may be applied to control a bank of switched capacitors which are used to tune the balun. An example implementation is shown in FIG. 5 which depicts a circuit schematic representation of the bank of switched capacitors 60 which are connected to the primary or second winding of the balun. As depicted, the switched capacitor bank 60 includes a plurality of tuning capacitors (e.g., C1 through C18), each of which is coupled between the balun input and a predetermined reference voltage, either directly or across a coupling transistor or switch (e.g., T2-T8 and T12-T18) which is controlled by one of the tuning control signals (Control 1 through Control 7). It will be appreciated that each of the individual capacitors C1-C18 can have the same capacitance value, or on or more of the individual capacitors can have different capacitance values, depending on the frequency bands of interest. In this example, the primary side of the balun is connected to receive the first and second circuit outputs (balun_in_1 and balun_in_2), which in turn are connected respectively to first and second predetermined reference voltages 61, 62 (e.g., ground) through one or more capacitors under control of the tuning control signals. With this configuration, the predetermined reference voltage 61 is connected across a first capacitor C1 to the first circuit output (balun_in_1) which is input to the balun, and at the same time the predetermined reference voltage 62 is connected across a second capacitor C11 to the second circuit output (balun_in_2) which is also input to the balun, thereby tuning the balun to a first predetermined center frequency. To change the tuning frequency of the balun, one or more additional capacitors (e.g., C2-C8 and C12-C18) are connected between the reference voltage(s) 61, 62 and the first and second circuit outputs by applying a tuning control signal to the gate of each transistor that couples the additional capacitor(s) to the reference voltage(s) 61, 62. Thus, when the tuning control signal Control 1 is "ON," the coupling transistors T2, T12 connect the additional capacitors C2, C12 into the switched capacitor bank 60, thereby changing the center frequency of the balun.

In similar fashion, one or more of the other control signals (Control 2 through Control 7) can be used to turn "ON" any of the additional coupling transistors T3-T8 and T13-T18 to connect the additional capacitors C3-C8 and C13-C18 into the switched capacitor bank 60 to tune the center frequency of the balun as desired.

Figure 6:
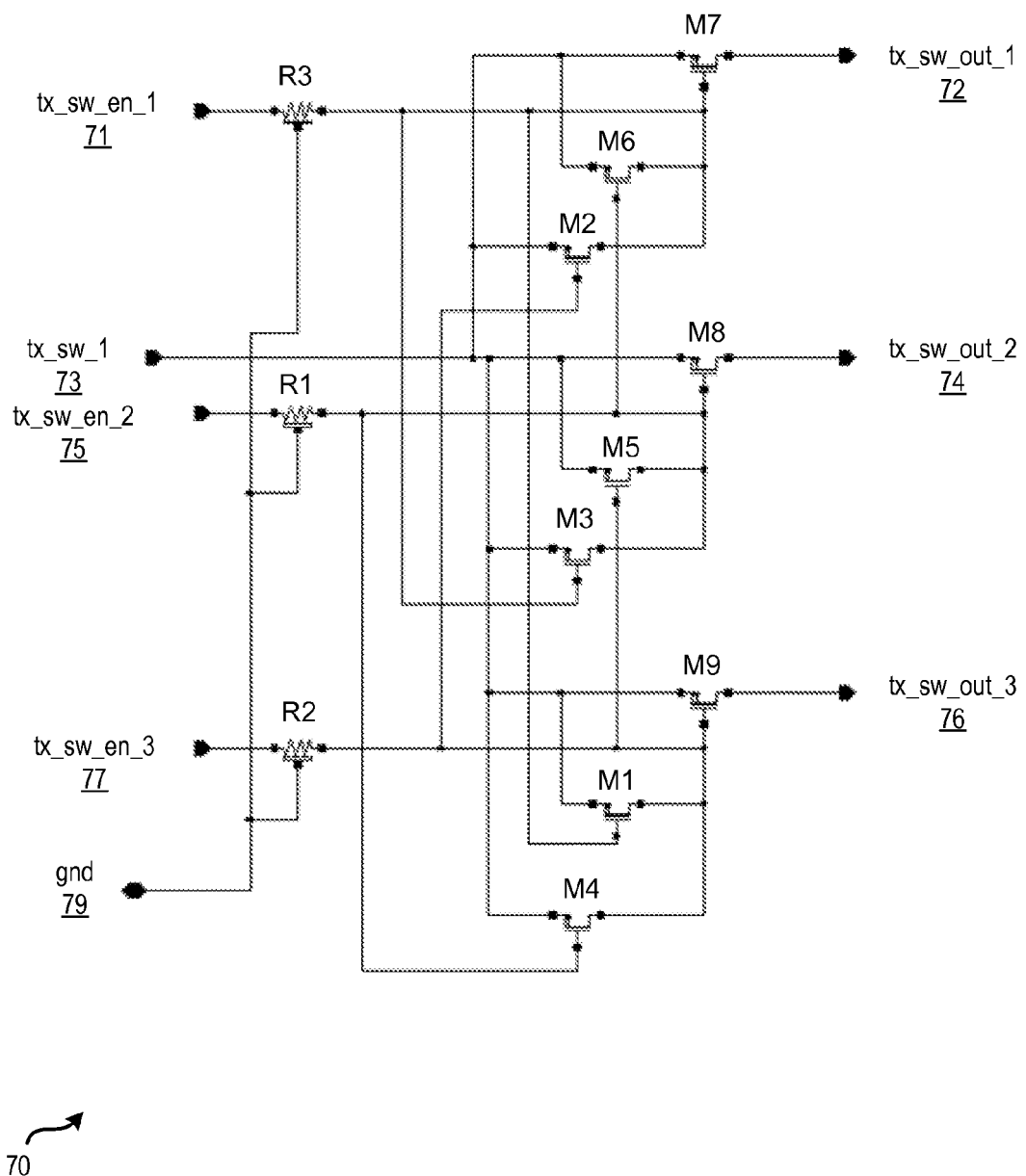
FIG. 6 is a circuit schematic representation of an output switch network for connecting the balun to the transmit power amplifiers.

Since different frequencies can be generated at the output winding of the tunable balun, separate power amplifier circuits may be required for each frequency or band. To this end, a switch network or a multiplexer is provided for connecting the tunable balun to one of a plurality of power amplifier circuits that is appropriate for the desired frequency. An example implementation of such a switch network is shown in FIG. 6 which depicts a circuit schematic representation of an output switch network 70 for connecting the balun to the transmit power amplifiers. In the depicted example, the switch network 70 is a single pole multiple throw switch which is connected to receive an input signal 73 (e.g., tx_sw_in) from the output winding of the balun, and to connect the received input signal 73 to the appropriate switch output 72, 74, 76 through a plurality of transistor switches (M1-M9) under control of the switching control signals 71, 75, 77 (e.g., tx_sw_en_1 through tx_sw_en_3), thereby connecting the balun's secondary terminal to the different inputs of the external power amplifier circuits. As illustrated, each of the input switching control signals (e.g., tx_sw_en_1, tx_sw_en_2, and tx_sw_en_3) is applied across a grounded input resistor (R3, R1, R2, respectively) to a plurality of transistors so that the received input signal 73 is routed to only a selected one of the switch outputs 72, 74, 76. When the only the first input switching control signal 71 is "HIGH" or "ON" and the other input switching control signals 75, 77 are "LOW or OFF," the output transistor M7 is turned "ON" to pass the input signal 73 to the first switch output 72, while the other output transistors M8, M9 are turned "OFF" (as are internal gating transistors M6, M2, M5, and M4), thereby preventing any other internal gating transistors that are turned "ON" (e.g., M3 and M1) from passing the input signal 73 to another switch output. In similar fashion, when the only the second input switching control signal 75 is "HIGH" or "ON" and the other input switching control signals 71, 77 are "LOW or OFF," the output transistor M8 is turned "ON" to pass the input signal 73 to the second switch output 74, while the other output transistors M7, M9 are turned "OFF" (as are internal gating transistors M2, M5, M3, and M1), thereby preventing any other internal gating transistors that are turned "ON" (e.g., M6 and M4) from passing the input signal 73 to another switch output.

Figure 7:
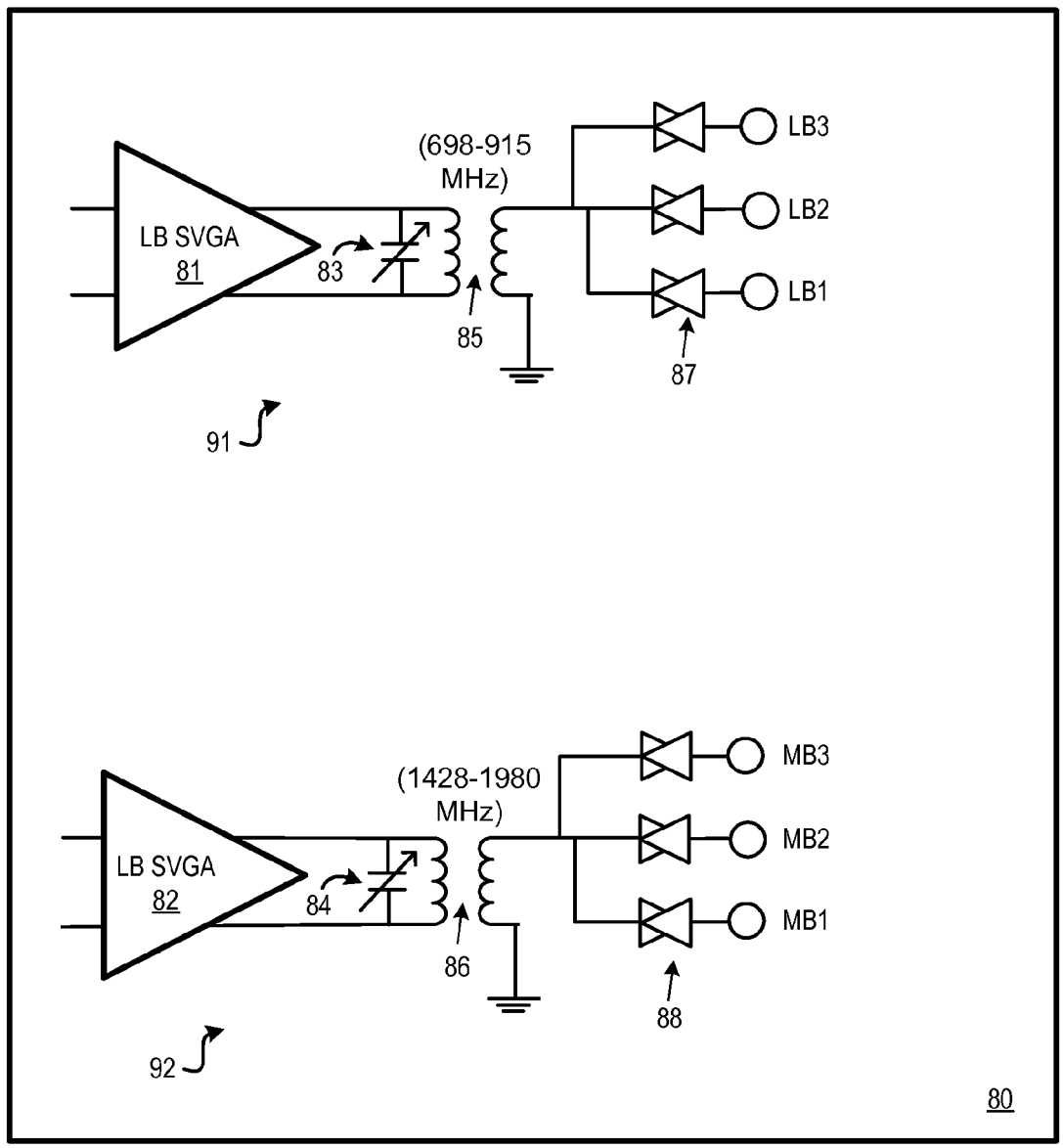
FIG. 7 is a simplified schematic illustration of an example implementation where two multi-band transmitters are used to support thirteen cellular bands with two SVGAs and two tunable baluns.

While a single SVGA-balun combination can be used to transmit signals over a plurality of frequency bands, there may be situations where the number of transmit frequency bands and/or modes of operation exceed the number of frequency bands that can be generated by a single SVGA-balun combination. In these cases, the reduced die area benefits of the present invention allow two separate SVGA-balun combinations to be included on a single wireless communication device, thereby supporting up to thirteen or fourteen cellular bands or any other frequency band of interest. An example implementation is depicted in FIG. 7 which depicts a simplified schematic illustration of two multi-band transmitters which are included on a single transceiver chip 80 to support thirteen cellular bands with only two SVGAs and two tunable baluns. A first multi-band transmitter 91 in the transmit subsystem 80 includes a first broadband SVGA 81 which is connected to a balun 85 by way of a first switched capacitor bank 83 at its primary winding which is used to tune the frequency of the balun 85 to a first predetermined low band frequency range (e.g., 698-915 MHz). In addition or in the alternative, the switched capacitor bank can be connected to the secondary winding of the balun 85 and still provide the balun tuning benefit. The multi-band transmitter 91 also includes a switched network or a multiplexer 87 for connecting the balun 85 to the lowband inputs LB1-LB3 of different low band power amplifiers.

In addition to the first multi-band transmitter 91 the transmit subsystem 80 includes a second multi-band transmitter 92 having a second broadband SVGA 82 and balun 86 which are connected by a second switched capacitor bank 84. Again, the second switched capacitor bank 84 is used to tune the frequency of the balun 86 to a second predetermined midband frequency range (e.g., 1428-1980 MHz). Using a switched network or a multiplexer 88, the balun 86 is connected to the midband inputs MB1-MB3 of different mid-band power amplifiers.

The RF multi-band transmitter described herein uses a single gain amplifier, tuning balun, and switch network to transmit on a plurality of frequency bands. With this configuration, an existing broadband SVGA design can be used which provides controlled gain steps over the frequencies of interest, and requires only minor design changes to add control bits to specify the additional frequency gain of the SVGA. In addition, there is a lower voltage drop since the number of SVGA modules (and therefore the current drop over the smaller resistance) is reduced. Another benefit of the disclosed configuration is that the total balun area may be reduced. This not only makes the transceiver circuit more compact, but also enables the use of narrowband baluns. In addition, the tunable balun design may be optimized to allow control of band selection by switching only the primary tuning capacitors, though secondary tuning capacitors can also be used. The smaller balun size also reduces the loading capacitance to the RF mixer, thereby reducing the current drain of the mixer, and improving control of the frequency for voltage peaking for harmonic rejection. In addition, the smaller balun size minimizes the balun-to-balun coupling which can lead to instability in the transmission chain and loss of power. The use of a shared VGA and balun for generating multiple RF bands not only reduces the overall device size, cost and power consumption, but also reduces the overall design complexity since, with a shared set of RF blocks or chains, the die routing is more simpler, the drive capability must be lower, and the design cycle time is decreased.

Figure 8:
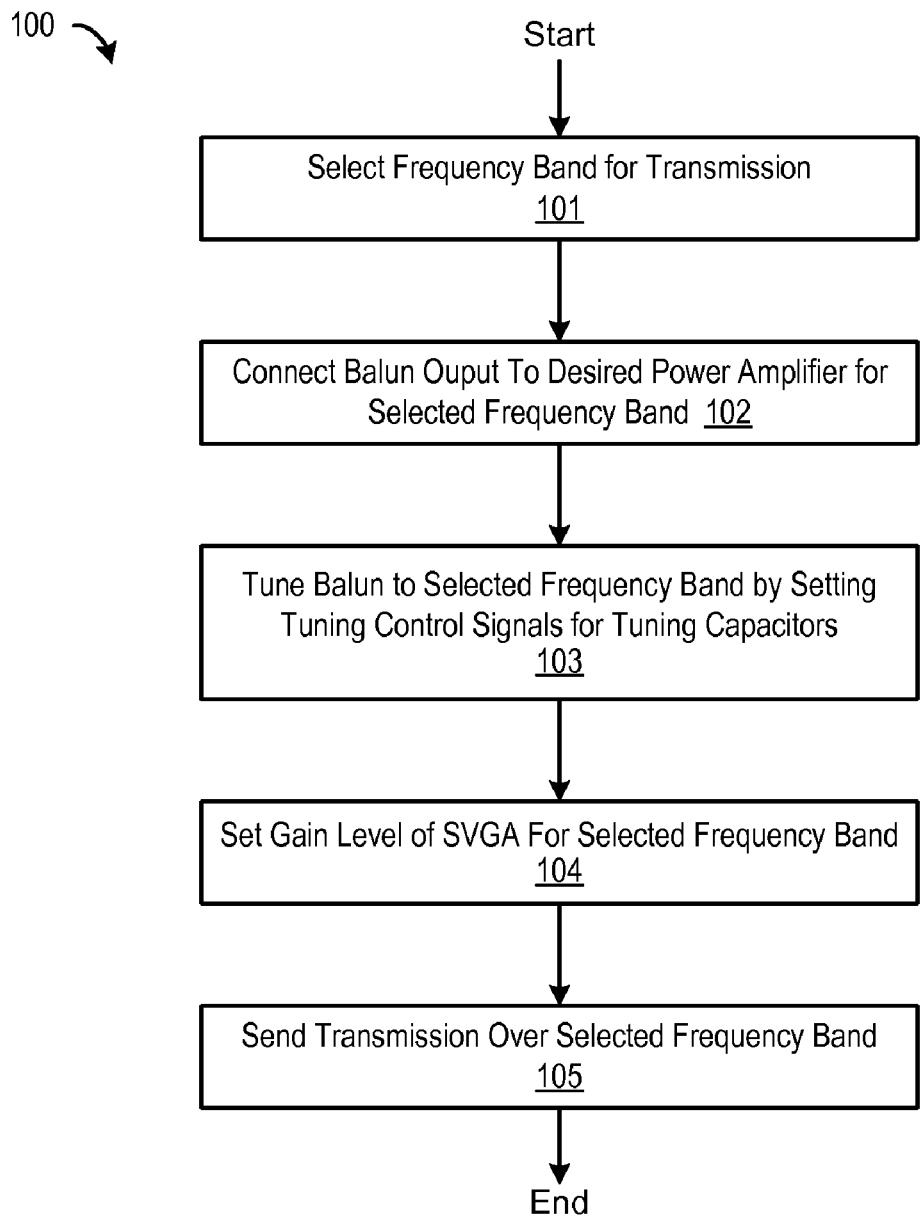
FIG. 8 depicts an example flow for controlling the transmission of data over a selected one of a plurality of frequency bands using a single amplifier, tunable balun and output switch network.

FIG. 8 depicts an example flow 100 for controlling the transmission of data over a selected one of a plurality of frequency bands using a single amplifier, tunable balun and output switch network. At the transmitter, the methodology starts when transmitter is operative to send or transmit data using one of a plurality of wireless communication standards. As an initial step 101, a transmission scheme is selected for wirelessly transmitting the data, where the different wireless transmission schemes (e.g., UMTS IMT, WCDMA, PCS, DSC, "900 band," "800 band," etc.) may each use a different frequency band to transmit data. Once the frequency band is selected, the tunable balun output is connected to the desired power amplifier for the selected frequency band at step 102, such as by setting switching control signals for an output switch network that is connected between the tunable balun and a plurality of power amplifiers. At step 103, the balun is tuned to the selected frequency band by setting one or more tuning control signals, such as by applying the appropriate tuning control signals to a bank of switched capacitors connected to the primary or secondary winding of the balun so that the center frequency of the balun is tuned to the selected frequency band. With a tunable balun, it is possible to adjust the frequency of the balun to different frequencies corresponding to any of a plurality of frequency bands. At step 104, the gain level for a configurable gain amplifier (such as a broadband SVGA) is tuned or set for the selected frequency band, such as by setting one or more control bits for the configurable gain amplifier circuit. As will be appreciated, the control bits can be re-used from within the system that are used to control other frequency dependent blocks such as the frequency synthesizer. By using control bits to configure the gain amplifier over a range of frequencies, it is possible to set the same gain amplifier to different gain settings corresponding to other selected frequency bands. While the specific sequencing of these steps may be changed or altered, the overall approach allows a single tunable balun and configurable gain amplifier to be shared among a plurality of dedicated power amplifier circuits over an output switch network so that the transmission may be sent over the selected frequency band at step 105.

By now it should be appreciated that there has been provided a multi-band RF transmitter circuit and transmission methodology for a wireless communication device. As disclosed, the multi-band RF transmitter circuit includes a shared preamplifier (e.g., a broadband SVGA) connected to receive a transmit signal and generate an amplified transmit signal at any of a plurality of predetermined frequency bands. The multi-band RF transmitter circuit also includes a shared tunable balun connected to receive the amplified transmit signal and to generate a balun output signal at any of the plurality of predetermined frequency bands. In selected embodiments, the shared tunable balun may be implemented with primary and secondary balun windings, and a bank of switched capacitors which are selectively coupled to the primary balun winding to generate the balun output signal at any of the plurality of predetermined frequency bands. In other embodiments, the shared tunable balun may be implemented with an integrated planar balun and a plurality of tuning capacitors coupled between the integrated planar balun and a predetermined reference voltage, either directly or across a coupling transistor which is controlled by one or more tuning control signals to generate the balun output signal at any of the plurality of predetermined frequency bands. In addition, the multi-band RF transmitter circuit includes an output switching network (e.g., a single pole multiple throw switch) configured to connect the balun output signal to any of a plurality of power amplifier circuits which correspond respectively to the plurality of predetermined frequency band. By connecting the output switching network to a plurality of power amplifier circuits, each power amplifier circuit may be designed to generate an amplified signal for one of the plurality of predetermined frequency bands. As disclosed herein, the shared preamplifier, shared tunable balun and output switching network may be integrated on a single transceiver integrated circuit, and may be configured to support data transmission on three different frequency bands.

In another form, there is provided an RF transmitter that is adapted to operate in at least two transmission bands. As disclosed, the RF transmitter includes a single gain amplifier (e.g., a segmented variable gain amplifier) which may be configured to provide a first gain value or a second gain value to an input RF signal, where the first gain value corresponds to a first selected transmission band and the second gain value corresponds to a second selected transmission band. The RF transmitter also includes a single tunable balun that is connected to an output of the single gain amplifier and that may be tuned to provide a first center frequency or a second center frequency, where the first center frequency corresponds to the first selected transmission band and the second center frequency corresponds to the second selected transmission band. In selected embodiments, the tunable balun may include a primary balun winding, a secondary balun winding, and a bank of switched capacitors which are selectively coupled to the primary balun winding and/or the secondary balun winding to generate a balun output signal at the output of the single tunable balun having either the first center frequency corresponding to the first selected transmission band or to the second center frequency corresponding to the second selected transmission band. In other embodiments, the tunable balun may include an integrated planar balun and a plurality of tuning capacitors coupled between the integrated planar balun and a predetermined reference voltage, either directly or across a coupling transistor, where the plurality of tuning capacitors are controlled by one or more tuning control signals to generate the balun output signal at the output of the single tunable balun having either the first selected transmission band or the second selected transmission band. A single output switch (e.g., a single pole multiple throw switch) is connected between an output of the single tunable balun and a plurality of RF power amplifiers to connect the output of the single tunable balun to a first RF power amplifier for transmission on the first selected transmission band, and to connect the output of the single tunable balun to a second RF power amplifier for transmission on the second selected transmission band. As disclosed herein, the single gain amplifier, single tunable balun, and single output switch preamplifier may be integrated on a single integrated circuit, and may be configured to support data transmission on three different frequency transmission bands.

In yet another form, there is disclosed a circuit which includes a first multi-band transmitter which has a first configurable gain amplifier for receiving and amplifying a first input RF signal; a first tunable balun connected to an output of the first configurable gain amplifier having a center frequency that can be selectively tuned to different transmission bands; and a first output switch circuit connected between an output of the first tunable balun and a first plurality of power amplifiers. In operation, the first multi-band transmitter may be configured to generate an RF transmission signal at any one of a first plurality of selectable transmission bands. The circuit may also include a second multi-band transmitter which has a second configurable gain amplifier for receiving and amplifying a first input RF signal, a second tunable balun connected to an output of the second configurable gain amplifier having a center frequency that can be selectively tuned to different transmission bands, and a second output switch circuit connected between an output of the second tunable balun and a second plurality of power amplifiers, where the second multi-band transmitter may be configured to generate an RF transmission signal at any one of a second plurality of selectable transmission bands. In either the first or second multi-band transmitters, the tunable balun may be formed with an integrated narrowband balun with first capacitor switched at a primary winding and a tuning capacitor at a secondary winding to tune the center frequency of the first tunable balun. In addition, the first or second output switch circuit may be formed with a single pole, multiple throw circuit that connects the secondary winding to different inputs of a plurality of external power amplifiers.

Although the described exemplary embodiments disclosed herein are directed to various multi-band transceiver systems and methods for using a single SVGA and tunable balun and switching network to enable the transceiver system to send out modulated RF signals at different frequencies, the present invention is not necessarily limited to the example embodiments illustrate herein. For example, various embodiments of a multi-band transceiver system and methodology disclosed herein may be implemented in connection with various proprietary or wireless communication standards, such as IEEE 802.16e, 3GPP-LTE, DVB and other multi-user systems, such as wireless MIMO systems, though multi-band transceiver systems can also be used in proprietary communication systems. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A multi-band RF transmitter circuit for a wireless communication device, comprising:
    a shared preamplifier connected to receive a transmit signal and generate an amplified transmit signal at any of a plurality of predetermined frequency bands;
    a shared tunable balun connected to receive the amplified transmit signal and to generate a balun output signal at any of the plurality of predetermined frequency bands; and
    an output switching network configured to connect the balun output signal to any of a plurality of power amplifier circuits which correspond respectively to the plurality of predetermined frequency bands.

2. The multi-band RF transmitter of claim 1, where the shared preamplifier comprises a broadband segmented variable gain amplifier.

3. The multi-band RF transmitter of claim 1, where the shared tunable balun comprises:
    a primary balun winding;
    a secondary balun winding; and
    a bank of switched capacitors which are selectively coupled to the primary balun winding or the secondary balun winding to generate the balun output signal at any of the plurality of predetermined frequency bands.

4. The multi-band RF transmitter of claim 1, where the shared tunable balun comprises:
    an integrated planar balun; and
    a plurality of tuning capacitors coupled between the integrated planar balun and a predetermined reference voltage, either directly or across a coupling transistor which is controlled by one or more tuning control signals to generate the balun output signal at any of the plurality of predetermined frequency bands.

5. The multi-band RF transmitter of claim 1, where the output switching network comprises a single pole multiple throw switch which connects the balun output signal to different inputs of the plurality of power amplifier circuits, where each power amplifier circuit generates an amplified signal for one of the plurality of predetermined frequency bands.

6. The multi-band RF transmitter of claim 1, further comprising the plurality of power amplifier circuits connected to the output switching network, where each power amplifier circuit generates an amplified signal for one of the plurality of predetermined frequency bands.

7. The multi-band RF transmitter of claim 1, where the shared preamplifier, shared tunable balun and output switching network are integrated on a single transceiver integrated circuit.

8. The multi-band RF transmitter of claim 1, where the shared preamplifier, shared tunable balun and output switching network are configured to support data transmission on three different frequency bands.

9. A radio frequency (RF) transmitter adapted to operate in at least two transmission bands, comprising:
a gain amplifier which may be configured to provide a plurality of gain values comprising a first gain value and a second gain value to an input RF signal, where the first gain value corresponds to a first selected transmission band and the second gain value corresponds to a second selected transmission band;
a tunable balun connected to an output of the gain amplifier which may be tuned to provide a plurality of center frequencies comprising a first center frequency and a second center frequency, where the first center frequency corresponds to the first selected transmission band and the second center frequency corresponds to the second selected transmission band;
an output switch connected between an output of the tunable balun and a plurality of RF power amplifiers to connect the output of the tunable balun to a first RF power amplifier of the plurality of RF power amplifiers for transmission on the first selected transmission band, and to connect the output of the tunable balun to a second RF power amplifier of the plurality of RF power amplifiers for transmission on the second selected transmission band.

10. The RF transmitter of claim 9, wherein the gain amplifier comprises a segmented variable gain amplifier.

11. The RF transmitter of claim 9, where the tunable balun comprises:
a primary balun winding;
a secondary balun winding; and
a bank of switched capacitors which are selectively coupled to at least one of the primary balun winding or the secondary balun winding to generate a balun output signal at the output of the tunable balun to thereby provide a plurality of center frequencies comprising the first center frequency corresponding to the first selected transmission band and to the second center frequency corresponding to the second selected transmission band.

12. The RF transmitter of claim 9, where the tunable balun comprises:
an integrated planar balun; and
a plurality of tuning capacitors coupled between the integrated planar balun and a predetermined reference voltage, either directly or across a coupling transistor, where the plurality of tuning capacitors are controlled by one or more tuning control signals to generate the balun output signal at the output of the tunable balun having one of the plurality of center frequencies comprising the first center frequency corresponding to the first selected transmission band and to the second center frequency corresponding to the second selected transmission band.

13. The RF transmitter of claim 9, where the output switch comprises a single pole multiple throw switch which connects the output of the tunable balun to the first RF power amplifier for generating a first amplified signal in the first selected transmission band, and which connects the output of the tunable balun to the second RF power amplifier for generating a second amplified signal in the second selected transmission band.

14. The RF transmitter of claim 9, further comprising a plurality of external RF power amplifiers connected to the output switching network.

15. The RF transmitter of claim 9, where the gain amplifier, tunable balun, and output switch preamplifier are integrated on a single integrated circuit.

16. The RF transmitter of claim 9, where the gain amplifier, tunable balun, and output switch preamplifier are configured to support data transmission on three different frequency transmission bands.

17. A circuit comprising:
a first multi-band transmitter comprising:
a first configurable gain amplifier for receiving and amplifying a first input RF signal;
a first tunable balun connected to an output of the first configurable gain amplifier having a center frequency that can be selectively tuned to different transmission bands; and
a first output switch circuit connected between an output of the first tunable balun and a first plurality of power amplifiers;
where the first multi-band transmitter is configured to generate an RF transmission signal at any one of a first plurality of selectable transmission bands.

18. The circuit of claim 17, further comprising:
a second multi-band transmitter comprising a second configurable gain amplifier for receiving and amplifying a first input RF signal, a second tunable balun connected to an output of the second configurable gain amplifier having a center frequency that can be selectively tuned to different transmission bands, and a second output switch circuit connected between an output of the second tunable balun and a second plurality of power amplifiers, where the second multi-band transmitter may be configured to generate an RF transmission signal at any one of a second plurality of selectable transmission bands.

19. The circuit of claim 17, where the first tunable balun comprises an integrated narrowband balun with first capacitor switched at a primary winding and a tuning capacitor at a secondary winding to tune the center frequency of the first tunable balun.

20. The circuit of claim 19, where the first output switch circuit comprises a single pole, multiple throw circuit that connects the secondary winding to different inputs of the first plurality of power amplifiers.

* * * * *